United States Patent [19]

Beaulieu et al.

[11] 3,851,221

[45] Nov. 26, 1974

[54] INTEGRATED CIRCUIT PACKAGE

[75] Inventors: Philip Edward Beaulieu, South Burlington; Joseph John Zabursky, Shelburne, both of Vt.

[73] Assignee: International Business Machines Corporation, Armonk, N.Y.

[22] Filed: Nov. 30, 1972

[21] Appl. No.: 310,751

[52] U.S. Cl. ...... 317/100, 317/101 D, 317/101 CC, 340/174 MA

[51] Int. Cl. ........ H05k 1/04

[58] Field of Search ......... 317/100, 101 CC, 101 A, 317/101 CM, 101 D; 340/174 MA

[56] References Cited

UNITED STATES PATENTS

| | | | |
|---|---|---|---|
| 3,741,292 | 6/1973 | Aakalu et al. | 317/100 |
| 3,764,856 | 10/1973 | Martin | 317/101 D |

OTHER PUBLICATIONS

Jarvela et al., "Stacked High-Density Multichip Module,"IBM Tech. Disc. Bull. Vol. 14, No. 10, 3–72 pp. 2896–2897.

Bleher et al., "Microelectric Packaging" IBM Tech. Disc. Bull. Vol. 12, No. 5, 10–69 p. 727.

Aakalu et al., "Integrated Cooling for High-Density Electronic Components," IBM Tech. Bull. Vol. 14, No. 8, 1–72 p. 2532.

Chapman et al., "Microelectronic Packaging Technique" IBM Tech. Bull. Vol. 6, No. 10, 3–64, p. 70.

*Primary Examiner*—David Smith, Jr.
*Attorney, Agent, or Firm*—Stephen J. Limanek

[57] ABSTRACT

This package is suitable for both high density, relatively low input or output circuitry, such as memory circuits, and lower density, high input or output circuitry, such as logic circuits. The package has a plurality of substrates in a stack, with the high input or output circuits mounted on the bottom substrate in the stack and the lower input or output circuits mounted in the remaining substrates of the stack. The bottom substrate forms a portion of one wall of the closed container and has a plurality of interconnection pins in an array coextensive with and carried by its bottom surface. The remaining substrates of the stack have interconnection means brazed around their peripheries which are solder bonded to the next substrate in the stack. The bottom substrate is thus able to have a very large number of input/output pins, and the remaining substrates can be easily separated from the stack for rework purposes. In a preferred form, the package is fluid cooled and contains heat transfer baffles for removing heat from the package.

7 Claims, 5 Drawing Figures

INTEGRATED CIRCUIT PACKAGE

BACKGROUND OF THE INVENTION

1. Field of the Invention

This invention relates to an improved integrated circuit package. More particularly it relates to such a package in which both high density integrated circuitry and integrated circuitry having a high input or output requirement may be packaged without compromising the environment needed for each.

2. Description of the Prior Art

The integrated circuit packaging art is a well developed one. In the packaging of integrated circuits for complex electronic equipment such as data processing system, the dominant approach to date has been to contain memory circuits and logic circuits in separate first level packages for a variety of reasons, including the fact that memory circuits tend to be of substantially greater density than logic circuits, but require a substantially lower number of inputs or outputs from or to the package. Another difference between logic circuits and memory circuits which is important from a packaging standpoint is that logic circuits tend to be faster than memory circuits in their operation. An example of such a prior art first level package is contained in an article by Mandel et al. "Heat Dissipator Assemblies," in the IBM Technical Disclosure Bulletin, Volume 8, No. 10, March 1966 pages 1,460–1,461. First level packages suitable for containing a large number of integrated circuits are also known in the art, as disclosed in, for example, U.S. Pat. No. 3,529,213. While such prior art packages are suitable for many purposes, they require compromises between the requirements of memory circuits and of logic circuits if the two are to be packaged together.

The use of liquid cooling for dissipating heat generated by the operation of integrated circuits is also known, as disclosed in, for example, commonly assigned Beaulieu, U.S. Pat. No. 3,537,063.

As integrated circuit operating speeds and densities increase, and as data processing system technology becomes more and more sophisticated, more and more stringent requirements are imposed for integrated circuit packaging. Thus, while the integrated circuit packaging art is a well developed one, further improvement in packaging techology is required to keep pace with the technology of the integrated circuits themselves.

SUMMARY OF THE INVENTION

Accordingly, it is an object of this invention to provide an integrated circuit package suitable for both high input or output requirement circuits and circuits having higher densities but lower input or output requirements.

It is another object of the invention to provide a single package containing both logic and memory circuits suitable for use in a computer environment.

It is a further object of the invention to provide a high density, fluid cooled package for both high density memory circuits and lower density, high input and output logic circuitry.

It is still another object of the invention to provide an integrated circuit package suitable for containing both a processing unit and a memory in integrated circuit form for a data processing system.

It is a still further object of the invention to provide a package of stacked integrated circuit substrates which is high density, has high input or output capability, and in which rework of the stack may be conveniently carried out.

It is another object of the invention to provide an integrated circuit package suitable for both memory and logic circuits in which the logic circuits undergo no speed penalty to be packaged with the memory circuits.

It is yet another object of the invention to provide a package of the above type having an improved heat transfer efficiency for removal of heat generated by operation of integrated circuits in the package.

The attainment of these and related objects may be accomplished through use of the integrated circuit package described herein. The package is a closed container including stacked substrates on which the integrated circuits are carried. A bottom substrate in the stack has a top surface and a bottom surface and has interconnection means substantially coextensive with the bottom surface of the substrate extending out of the closed container. One or more additional substrates is provided in the stack. These additional substrates are joined by interconnection means around their periphery to the bottom substrate or the next substrate below the additional substrate in the stack. A plurality of integrated circuits of a first type are provided on the additional substrate or substrates electrically connected to the interconnection means joining the substrate to the next adjacent substrate below it in the stack. A plurality of integrated circuits of a second type is provided on the bottom substrate electrically connected to the interconnection means extending out of the closed container. The second type of integrated circuit has a greater requirement for input or output interconnections than the first type of integrated circuit. Typically, the first type of integrated circuit is an array of memory storage circuits and the second type of integrated circuit is a plurality of logic circuits suitable for interacting with the memory storage circuits. The memory circuits are typically very dense but require a relatively lower number of interconnections than the less dense logic circuits. The logic circuits are also usually faster in speed and less tolerant of delays caused by longer circuit paths than the memory circuits.

By packaging the circuits in this way, the logic circuits are mounted on the bottom substrate, which has essentially its whole surface area available for interconnections through the substrate and out of the package, while the higher density memory circuits are packaged in the upper substrates of the stack, which have interconnections only around their periphery. Consistent with their speed requirements, the circuit paths to the logic circuits are also shorter than to the memory circuits, since the logic circuits are closest to the interconnections from the package to the outside world. Confining the interconnections of the upper substrates to their periphery means that the stack may be conveniently fabricated by solder reflow techniques and also conveniently separated by solder reflow techniques for replacement of integrated circuits contained on substrates within the stack that fail in use.

While the package of this invention is particularly adapted for packaging memory and logic circuits used in data processing systems, the high density, ease of fabrication and rework, high cooling capability and inherent simplicity of this structure should make it advantageous for use with a wide variety of other types of integrated circuits in a wide variety of other environments as well.

The foregoing and other objects, features and advantages of the invention will be apparent from the following more particular description of a preferred embodiment of the invention, as illustrated in the accompanying drawings.

DESCRIPTION OF THE PREFERRED EMBODIMENT

Figure 1:
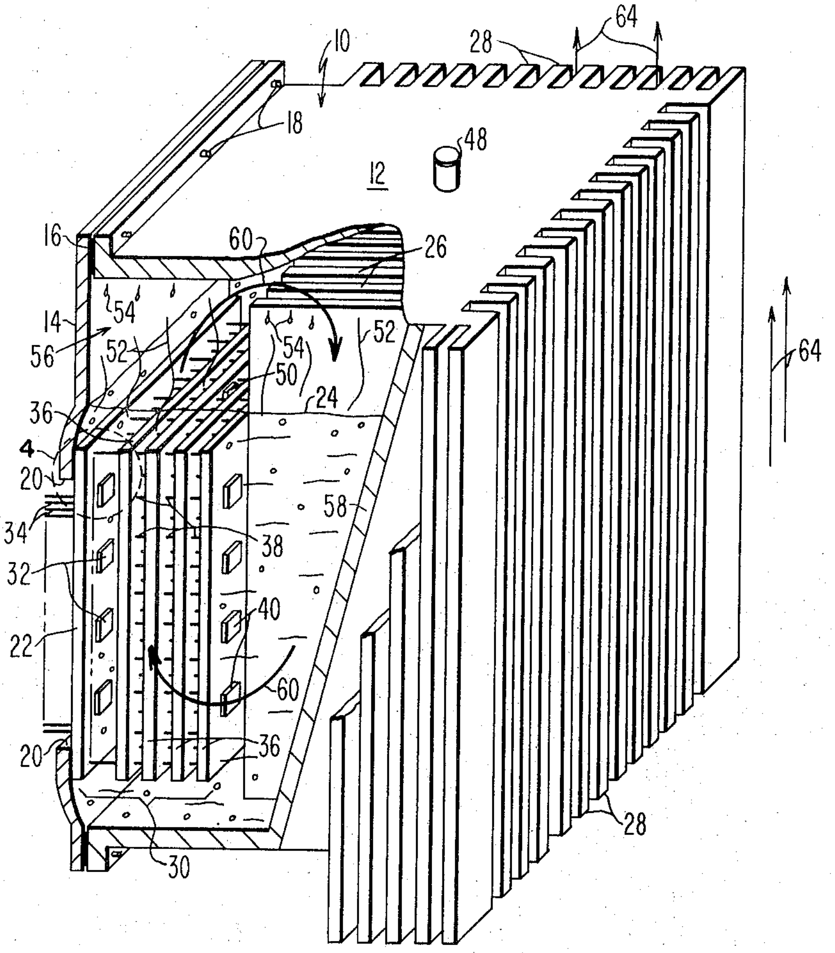
FIG. 1 is a perspective view of an embodiment of the claimed package, with a partial cutaway to show interior detail.

Referring now to the drawings, more particularly to FIG. 1, features of an integrated circuit package in accordance with the invention are shown. The package includes a closed container 10, formed by housing 12 and base plate 14, which is fastened to housing 12 in sealing relationship by rubber gasket 16 and screws 18. Base plate 14 has an opening 20, against which bottom substrate 22 is mounted through use of a suitable adhesive. The closed container so defined is partially filled with a liquid coolant 24, such as a fluorinated hydrocarbon, available from E. I. DuPont de Nemours and Company, Wilmington, Delaware, under the trademark Freon, or the like. A plurality of heat exchange baffles 26 are provided inside the closed container. Additional heat exchange baffles 28 are provided on the exterior of the container.

Figure 2:
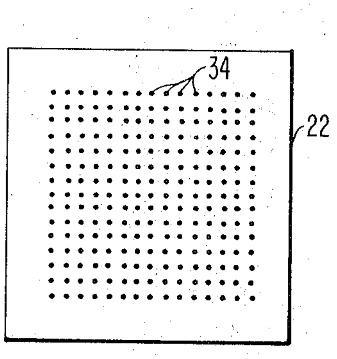
FIG. 2 is a bottom view of a bottom substrate in the package shown in FIG. 1.

Turning to FIGS. 1 and 2, the features of bottom substrate 22 in stack 30 are shown. The substrate 22 may be either a single layer of alumina ceramic, or if a very large interconnection capability for integrated circuit chips 32 mounted on its surface is needed, substrate 22 may be a multilayer ceramic having metallized interconnection lines embedded within it in a manner known in the art. Since substrate 22 is the bottom substrate in stack 30, it has an array of input/output contact pins 34 coextensive with its surface, except where it is bonded to base plate 14. The contact pins 34 are each electrically connected to one or more of the integrated circuit chips 32. In this manner, a large number of input or output connections for the integrated circuit chips 32 mounted on the upper surface of bottom substrate 22 is provided. Since substrate 22 is at the bottom of stack 30, the presence of pins 34 across the entire surface does not interfere with rework operations in which it may be necessary to separate stack 30.

Figure 3:
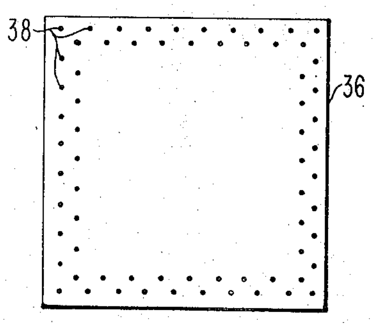
FIG. 3 is a bottom view of one of an additional substrate included in the package shown in FIG. 1.

In addition to bottom substrate 22, additional substrates 36 are provided in the package, as shown best in FIGS. 1 and 3. Unlike bottom substrate 22, the additional substrates 36 have pins 38 disposed only around the peripheries of the substrate. Mounted on each of the additional substrates 36 in stack 30 are memory integrated circuit chips 40. The memory integrated circuit chips 40 contain a very large number, e.g., 16,000, 32,000 of even 64,000 individual memory circuits plus associated on chip decode circuitry. While it is extremely dense, the nature of such memory circuits and their directly associated support circuits is that they require a relatively small number of input or output connections from the chip or its supporting substrate 36. The relatively small number of input/output pins 38 for each substrate 36 that may be provided around the periphery of substrates 36 is thus adequate to meet the input or output requirements of memory integrated circuit chips 40.

The integrated circuit chips 32 mounted on bottom substrate 22 in stack 30 contain logic circuits. Logic circuits tend to be less regular in their configuration than memory circuits, and they are therefore less dense than memory circuits. In comparison to the 16,000 – 64,000 memory circuits contained in each memory circuit chip 40, a logic integrated circuit chip 32 may contain no more than about 1,000 circuits. While the number of circuits per chip 32 is substantially lower than in the case of the memory integrated circuit chips 40, the logic integrated circuit chips 32 require substantially more inputs and outputs. The larger number of pins 34 that may be provided across the entire surface of bottom substrates 22 is therefore consistent with the requirements of logic integrated circuit chips 32. The memory circuits in chips 40 are considerably slower speed in operation than the logic circuits in chips 32. Typically, the speed difference between memory and logic circuits is one or more orders of magnitude. The shorter circuit path to chips 32 is therefore of advantage in avoiding delays caused by a longer path, such as to chips 40. In this connection while the logic circuits in chips 32 usually interact with the memory circuits in chips 40, inputs are sometimes supplied to chips 32, a function is performed there, and an output supplied on pins 34 without utilizing the memory circuits in chips 40. The placement of logic chips 32 on the bottom substrate 22 is particularly advantageous for this situation.

Figure 4:
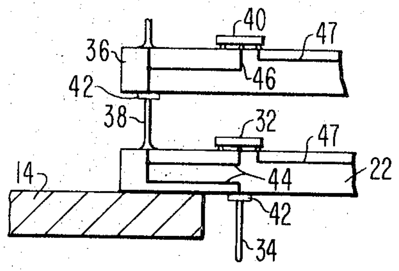
FIG. 4 is an enlarged cross section of a portion of the package shown in region 4 in FIG. 1.

In use, the package is fabricated by mounting as many as 50 or 100 of the logic integrated circuit chips 32 on the upper surface of bottom substrate 22 and by mounting the memory chips in the same manner, such as by solder reflow flip chip bonding, to the upper surfaces of their substrates 36. As shown in FIG. 4, pins 34 and 38 are brazed by their heads 42 to their respective substrates 22 and 36. The pins 38 are then coated with solder, such as by dipping. The stack is then formed by solder reflow bonding the pins 38 to the substrate below, as shown most clearly in FIG. 4. As further shown there, pins 34 and 38 are connected by interconnection metallurgy 44 to logic integrated circuit chip 32 on the surface of substrate 22. Pin 38, carried by substrate 36, is connected to memory integrated circuit 40 carried by substrate 36 through interconnection metallurgy 46. Additional interconnection metallurgy 47 within substrates 22 and 36 serves to connect memory chip 40 to another memory chip (not shown) on substrate 36 and to connect logic chip 32 to another logic chip (also not shown) on substrate 22.

Should any of the integrated circuits in logic chips 32 or memory chips 40 fail in use, the failing chip 40 or 32 can be replaced by reflowing the solder bonds joining pins 38 to the next adjacent lower substrate to separate the stack, then reflowing solder bonds joining the chip 40 or 32 to its substrate 36 or 22. A new chip is then solder reflow bonded to replace the failing chip, and the stack is then solder reflow bonded together again. Such solder reflow operations are well known in the art and are discussed in, for example, commonly assigned Papadopoulos et al., application Ser. No. 52,237, filed July 6, 1970; Ward, application Ser. No. 139,063, filed Apr. 30, 1971; and Reynolds, application Ser. No. 247,613, filed Apr. 26, 1972, the disclosures of which are incorporated by reference herein. Should a chip on the top substrate 36 in stack 30 fail, the stack of course, need not be separated prior to removing and replacing the failing chip. Since all of the solder bonds fastening the substrates 36 and 22 together to form the stack 30 are around the peripheries of the substrates 22 and 36, separation of the substrates from the stack may be conveniently carried out by infrared or other heat in a known manner, without disturbing solder bonds joining chips 32 and 40 to their substrates.

An assembled stack 30 of bottom substrate 22 and additional substrates 36 is fastened to base plate 14 by bonding bottom substrate 22 to the base plate with, for example, a suitable adhesive. Base plate 14 and housing 12 are then sealed together to form the closed container. The liquid coolant 24 is introduced through an opening in the top of the container, which is then sealed with a suitable plug 48 (shown in FIG. 1). Plug 48 may incorporate a pressure relief valve, if desired. As shown in FIG. 1, a sufficient quantity of liquid coolant is introduced to cover all of the chips in the stack 30. It is desirable, however, to leave an air space 56 above the liquid coolant 24, to allow gas compression from increased temperatures of the package in operation. Immersion of the chips 32 and 40 in the liquid coolant prevents the chips from becoming hot enough in operation to damage them. For protecting the chips 32 and 40 against heat damage, a heat sensitive integrated circuit chip 50 (shown best in FIG. 1) is provided to inhibit operation of the circuits in chips 32 and 40 and trigger a suitable alarm should the level of liquid coolant 24 fall below chip 50.

Figure 5:
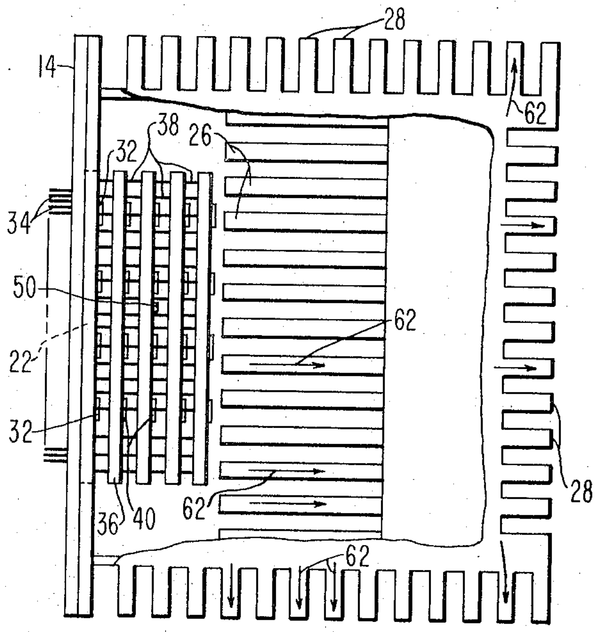
FIG. 5 is a top view of the package shown in FIG. 1, with a partial cutaway to show interior detail.

Referral to FIGS. 1 and 5 of the drawings shows the function of the liquid coolant 24, the heat exchange baffles 26 inside the container and the heat exchange baffles 28 outside the container for removing heat generated by operation of the integrated circuits in chips 32 and 40. Liquid coolant 24 removes heat from the chips 32 and 40 by nucleate boiling and recondensation. Vapor 52 rises from the coolant 24 and condenses into droplets 54 on the surfaces of the closed container 10 in the air space 56 above the liquid coolant 24. It should be noted that wall 58 of the closed container is slanted so that the interior of the container is larger at its top than at its bottom for maximum heat transfer efficiency. Fluid coolant 24 and vapor 52 tend to circulate as indicated by arrows 60.

Arrows 62 in FIG. 5 represent the path of heat flow for removal from the integrated circuit package. Through the circulation of liquid coolant 24 and vapor 52 as explained above, together with condensation of the vapor, large quantities of heat are first moved from the region of stack 30 to the fluid 24 and to air space 56. Heat transfer is accomplished through condensation of the vapor on the baffles 26 in the air space 56 and through conduction to the portion of the baffles 26 immersed in the fluid 24. The condensation imparts the bulk of this heat to heat exchange baffles 26 and the walls of closed container 10. Since heat represents a form of energy, it tends to flow from an area of higher temperature to an area of lower temperature. It therefore moves through the walls of the container to exterior baffles 28 as well as along heat transfer baffles 26 to exterior baffles 28 as shown by arrows 62. For removal of the heat from exterior baffles 28, air flow 64 absorbs the heat due to its lower temperature.

In practice, the integrated circuit package of this invention is capable of containing a very large number of integrated circuits which generate a substantial quantity of heat and also in removing this excess heat in a very efficient manner. For the sake of convenience and ease of illustration, a relatively small number of integrated circuit chips and pins have been depicted in the drawings. In an actual integrated circuit package in accordance with the invention, bottom substrate 22 may contain, for example, about 1,700 pins 34. Additional substrates 36 above the bottom substrate 22 may contain about 250 pins 38 about their peripheries. If used to package logic integrated circuits on bottom substrate 22 and memory integrated circuits on additional substrates 36, both the bottom substrates and the additional substrates 36 would each contain about 100 integrated circuit chips. While the number of integrated circuit chips is the same for the bottom substrate 22 and each additional substrate 36, the difference in number of input pins 34 and 38, for each substrate type respectively, illustrates the difference in input/output requirements for logic and memory circuits. With these numbers of circuits, the size of a package as shown in FIG. 1 may be approximately 5 inches on a side and contain memory and logic circuitry corresponding to that contained in a presently available medium size data processing system, such as an IBM System 370/Model 145.

It should now be apparent that an integrated circuit package capable of attaining the stated objects of the invention has been provided. The package efficiently contains a large number of dense integrated circuits having a relatively low input/output requirement and a slower speed, such as memory circuits, and relatively less dense, faster logic integrated circuits having a relatively high input/output requirement. The package further allows efficient removal of excess heat generated by the large number of integrated circuits contained in it. Further, the package allows convenient removal and rework of integrated circuits which fail in use, so that non-failing integrated circuits contained in the package may continue to be used.

While the invention has been particularly shown and described with reference to a preferred embodiment thereof, it will be understood by those skilled in the art that various changes in form and detail may be made therein without departing from the spirit and scope of the invention. For example, instead of providing the integrated circuits in a large number of relatively small chips, the circuits may be packaged in the stack in a full wafer form as fabricated, rather than diced into the chips. Alternatively, chips could be provided on both surfaces of the upper substrates to increase packaging density. For even more efficient heat transfer in some applications, it may be desirable to provide an exterior liquid jacket on the container in place of exterior baffles 28.

What is claimed is:

1. A package for integrated circuits comprising:

A. a closed container formed by a plurality of sides,

B. interconnection pins disposed outside said container and supported at one of said sides, C. a plurality of spaced-apart, horizontally stacked substrates, having first and second major surfaces disposed in vertical planes, carrying integrated logic and memory circuits at one of said surfaces, a first of said substrates being disposed within said container adjacent said one side carrying said logic circuits at the first surface thereof, D. means for connecting said interconnection pins to said logic circuits carried on said first substrate, E. a plurality of electrical conductors disposed at the periphery of said substrates, F. means for interconnecting said logic circuits on said first substrate with said memory circuits carried on other of said plurality of substrates through said plurality of electrical conductors and G. cooling means having a fluid coolant in said container in contact with said first and second surfaces.

2. A package for integrated circuits as set forth in claim 1 wherein said first substrate carries semiconductor chips having said integrated logic circuits disposed therein and said plurality of electrical conductors support said other substrates from said first substrate.

3. A package for integrated circuits as set forth in claim 1 wherein said cooling means includes a fluid coolant capable of nucleate boiling and heat exchange baffles communicating with said fluid coolant.

4. A package for integrated circuits as set forth in claim 2 wherein said first substrate is a multilayer ceramic substrate.

5. A package for integrated circuits as set forth in claim 2 wherein said interconnection pins are disposed in an array substantially coextensive with the second surface of said first substrate.

6. A package for integrated circuits as set forth in claim 5 wherein the number of interconnection pins substantially exceeds the number of conductors of said plurality of electrical conductors.

7. A package for integrated circuits as set forth in claim 2 wherein said other substrates carry semiconductor chips having integrated memory circuits disposed therein.

* * * * *